(12) United States Patent
Desai et al.

(10) Patent No.: US 9,917,001 B2
(45) Date of Patent: Mar. 13, 2018

(54) HIGH TEMPERATURE FINE GRAIN ALUMINUM HEATER

(75) Inventors: Abhi Desai, Fremont, CA (US); Robert T. Hirahara, San Jose, CA (US); Calvin Augason, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1286 days.

(21) Appl. No.: 12/017,285

(22) Filed: Jan. 21, 2008

(65) Prior Publication Data

US 2009/0184093 A1 Jul. 23, 2009

(51) Int. Cl.
*H05B 3/68* (2006.01)
*H01L 21/687* (2006.01)
*H01L 21/67* (2006.01)

(52) U.S. Cl.
CPC .. *H01L 21/68792* (2013.01); *H01L 21/67103* (2013.01)

(58) Field of Classification Search
CPC ... C23C 16/00; H01L 21/67; H01L 21/67103; H01L 21/68785
USPC ......... 219/443.1, 444.1, 117.1, 460.1, 461.1, 219/462.1, 544, 538
See application file for complete search history.

(56) References Cited

U.S. PATENT DOCUMENTS

| | | | |
|---|---|---|---|
| 4,469,757 A * | 9/1984 | Ghosh et al. | 428/614 |
| 5,087,297 A * | 2/1992 | Pouliquen | C22F 1/04 |
| | | | 148/437 |
| 5,476,548 A * | 12/1995 | Lei | C23C 16/45521 |
| | | | 118/500 |
| 6,231,674 B1 * | 5/2001 | Chen | C23C 16/45521 |
| | | | 118/500 |
| 6,464,790 B1 * | 10/2002 | Sherstinsky | C23C 16/45521 |
| | | | 118/500 |
| 7,048,814 B2 | 5/2006 | Lin et al. | |
| 7,189,946 B2 * | 3/2007 | Goto | H01L 21/67103 |
| | | | 219/444.1 |
| 2003/0003281 A1 * | 1/2003 | Catteau et al. | 428/213 |
| 2004/0221959 A1 | 11/2004 | Choi et al. | |
| 2005/0082274 A1 | 4/2005 | Kondou et al. | |

(Continued)

FOREIGN PATENT DOCUMENTS

| | | |
|---|---|---|
| JP | 06-326081 | 11/1994 |
| JP | 11-043734 | 2/1999 |

(Continued)

OTHER PUBLICATIONS

Notice to File a Response dated Nov. 29, 2010 in Korean Application No. 10-2008-0005778.

(Continued)

*Primary Examiner* — Quang D Thanh
*Assistant Examiner* — Ayub Maye
(74) *Attorney, Agent, or Firm* — Patterson + Sheridan LLP (57) ABSTRACT

An aluminum heated substrate support suitable for use in high temperature substrate processing systems and method for fabricating the same are provided. In one embodiment, an aluminum heated substrate support can include an aluminum body, a stem coupled to the body and a heating element disposed in the body. The body has an average grain size less than about 250 μm. In some embodiments, the stem to body joint is a fully penetrated lap weld that promotes service life of the substrate support.

18 Claims, 5 Drawing Sheets

(56) References Cited

U.S. PATENT DOCUMENTS

| | | |
|---|---|---|
| 2005/0118450 A1 | 6/2005 | Fujii et al. |
| 2006/0075970 A1 | 4/2006 | Guenther et al. |
| 2006/0081601 A1 | 4/2006 | Futakuchiya et al. |
| 2007/0090516 A1* | 4/2007 | White .............. H01L 21/67103 257/704 |

FOREIGN PATENT DOCUMENTS

| | | |
|---|---|---|
| JP | 2003-100851 | 4/2003 |
| JP | 2006-049568 | 2/2006 |
| WO | WO-03066920 A1 | 8/2003 |

OTHER PUBLICATIONS

Office Action dated Nov. 22, 2011 for Japanese Patent Application No. 2008-006487.
Office Action dated Feb. 28, 2013, for Chinese Application No. 2013022500950840.
Office Action dated Aug. 30, 2013, for Taiwan Application No. 97101540.

* cited by examiner

HIGH TEMPERATURE FINE GRAIN ALUMINUM HEATER

BACKGROUND OF THE INVENTION

Field of the Invention

The embodiments of the invention generally relate to an aluminum substrate support suitable for use in high temperature semiconductor processing systems.

Background of the Related Art

Integrated circuits have evolved into complex devices that can include millions of transistors, capacitors and resistors on a single chip. The evolution of chip designs continually requires faster circuitry and greater circuit density that demand increasingly precise fabrication processes. One fabrication process frequently used is chemical vapor deposition (CVD).

Chemical vapor deposition is generally employed to deposit a thin film on a substrate, such as a semiconductor wafer. Chemical vapor deposition is generally accomplished by introducing a precursor gas in to a vacuum chamber. The precursor gas is typically directed through a showerhead situated near the top of the chamber. The precursor gas reacts to form a layer of material on a surface of the substrate that is positioned on a heated substrate support. Purge gas is routed through holes in the support to the edge of the substrate to prevent deposition at the substrate's edge that may cause the substrate to adhere to the support or flake off during processing. Volatile by-products produced during the reaction are pumped from the chamber through an exhaust system.

One material frequently formed on substrates using a chemical vapor deposition process is tungsten. A precursor gas that may be used to form tungsten generally includes tungsten hexafluoride ($WF_6$) and silane. As the silane and tungsten hexafluoride mix, some "stray" tungsten (i.e., tungsten that does not deposit on the substrate) deposits on the showerhead and other chamber components. The stray tungsten film builds on the showerhead and may become a source of contamination in the chamber. Eventually, the stray tungsten may clog the holes in the showerhead that facilitate the passage of the precursor gas therethrough necessitating the showerhead be removed and cleaned or replaced. Chemical vapor deposition chambers also often require periodic cleaning after depositing other materials, for example dielectric materials such as $SiO_2$.

To extend the interval in time between the routine maintenance of the showerhead, fluorine based chemistries are generally used to clean (i.e., etch away) the stray tungsten film. The fluorine base chemistry also reacts to form a layer of aluminum fluoride (AlFx) on the heated support that is commonly made of aluminum. The aluminum fluoride (AlFx) layer, if present in a controlled and uniform state, provides a protective coating and sacrificial layer over the heated support. However, if the aluminum fluoride (AlFx) growth becomes random or excessive between different areas of the heated support, the AlFx layer can become defect ridden, and/or form selectively at initiation sites that generate flakes and particles, thus detrimentally becoming a particle generation and contamination source.

Many conventional aluminum substrate supports are forgings or castings. Forging processes are difficult to control and, as such, forged substrate supports generally exhibit a wide range of material properties, such as a wide range of grain sizes. Casting processes can also exhibit control difficulties which can result in a wide range of material properties, such as a wide range of grain sizes. The inventors have discovered that forged and cast substrate supports exhibiting large grain sizes have poor aluminum fluoride (AlFx) performance, i.e., the aluminum fluoride (AlFx) film has large amounts of defects, high particle generation and, consequently, short service life. Thus, it would be beneficial to produce an aluminum heated substrate support having an advantageous grain size distribution that does enhance the performance of adhered aluminum fluoride (AlFx) films.

Moreover, the heater body and stem joint of the substrate support must be configured to enable the use of such heaters at high temperatures. As the substrate support may be utilized at process temperatures ranging upward of 400 to 480 degrees Celsius, which is well in excess of recommended aluminum operational temperatures. Weld cracking may promote failure of the adhered aluminum fluoride (AlFx) films, along with vacuum leakage problems.

Therefore, there is a need in the art for an improved heated support suitable for use in chemical vapor deposition processes.

SUMMARY OF THE INVENTION

An aluminum heated substrate support suitable for use in high temperature substrate processing systems and method for fabricating the same are provided. In some embodiments, an aluminum heated substrate support can include an aluminum body, a heating element embedded in the body and a stem coupled to the body. The aluminum body has an average grain size less than about 250 µm. The stem is coupled to a bottom of the body using a fully penetrated lap weld joint.

In some other embodiments, an aluminum heated substrate support can include a cast aluminum body having an embedded heating element. The cast aluminum body includes a grain enhancer that produces an average grain size less than about 250 µm. In certain embodiments, the grain enhancer is titanium (Ti). In one embodiment, between about 0.03 to about 0.1 weight percent of grain enhancer is utilized to produce an average grain size less than about 250 µm. A stem may be coupled to a bottom of the body using a fully penetrated lap weld joint.

In some other embodiments, an aluminum heated substrate support can include an aluminum body fabricated from rolled wrought plate stock having an average grain size less than about 250 µm. The body has a mechanically embedded heating element disposed therein.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. It is also contemplated that features of one embodiment may be beneficially utilized in other embodiments without further recitation.

DETAILED DESCRIPTION

Figure 1:
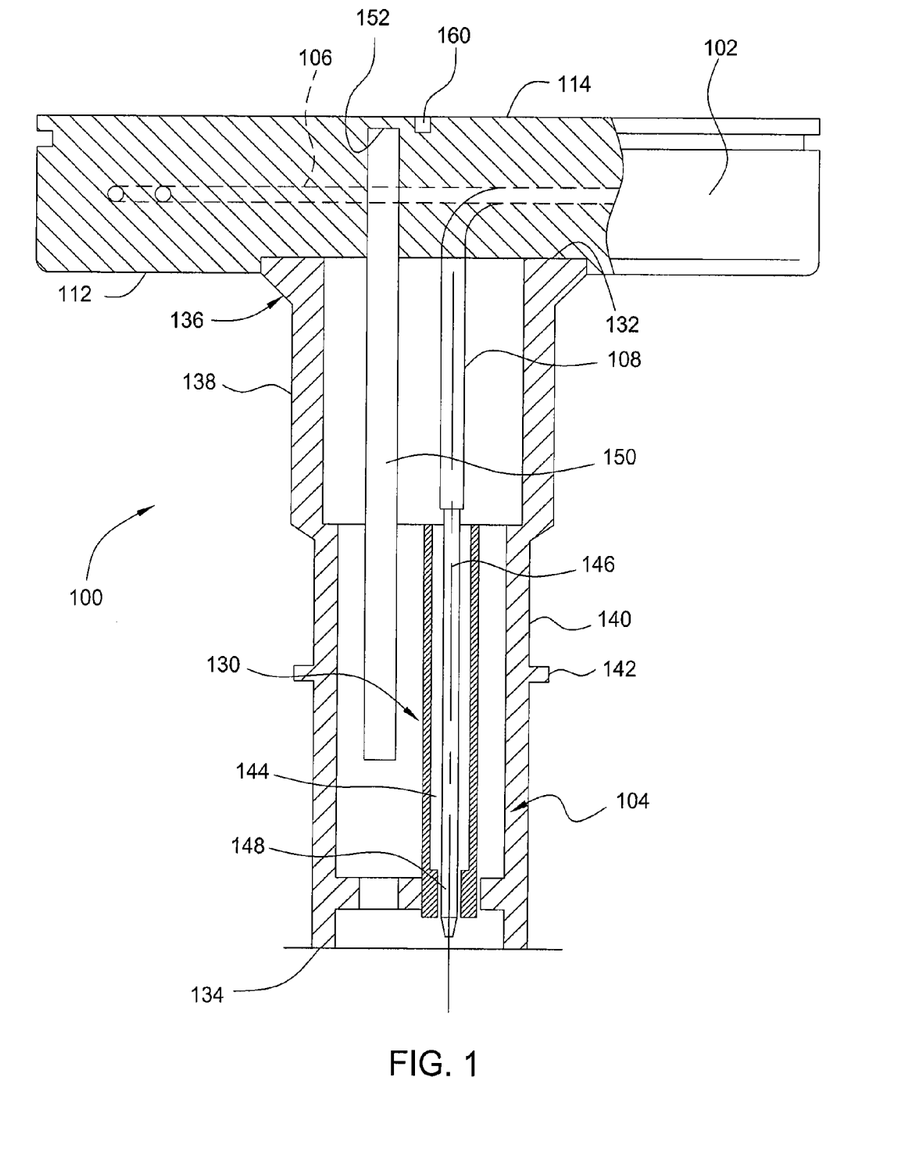
FIG. 1 is a vertical sectional view of one embodiment of a heated substrate support suitable for use with high temperature processing environments.

FIG. 1 depicts one embodiment of heated aluminum substrate support 100 suitable for use at high temperatures in a semiconductor processing system (not shown). One suitable semiconductor processing system that may be adapted to utilize the invention is a CENTURA® CVD processing system, available from Applied Materials, Inc., located in Santa Clara, Calif. It is contemplated that the heated aluminum substrate support 100 of the present invention may be utilized in other processing systems, including those available from other manufacturers.

The heated aluminum substrate support 100 includes a disk-like body 102, a stem 104 and a heating element 106. The stem 104 is generally tubular member having a first end 132 that is coupled to the body 102 and an opposing second end 134. The stem 104 includes a mounting flange 136 disposed at the first end 132 for coupling the stem 104 to a bottom surface 112 the body 102, as further discussed below. The stem 104 also includes an upper main shaft 138 and a lower main shaft 140. The upper main shaft 138 has a diameter greater than the lower main shaft 140. The lower main shaft 140 includes an annular rib 142 that extends outward to approximately the diameter of the upper main shaft 138.

Two ceramic heater tubes 130 are disposed within the stem 104. The tubes 130 are coupled to an internal flange 144 of the stem 104 disposed proximate the second end 134. A conductive rod 146 is disposed through each tube 130 and coupled to respective heater leads 108. A connector pin 148 is brazed or otherwise coupled to the conductive rod 146. The pin 148 extends beyond the tube 130 to facilitate coupling power the heating element 106.

A guide tube 150 is also provided through the stem 104 to facilitate placement of a sensor (not shown) in the body 102. In the embodiment depicted in FIG. 1, the tube 150 extends into a blind hole 152 formed in the bottom surface 112 of the body 102.

The body 102 is fabricated from aluminum and has an average grain size less than about 250 μm. An average grain size less than about 250 μm ensures a more uniform dispersion of impurities within the aluminum material comprising the body 102. The grain size of the body 102 ensures a more uniform dispersion of impurities by increasing the grain boundary surface area and limiting the size of the point defects caused by the impurities sitting at the grain boundaries. Thus, the body 102 will have fewer and more dispersed point defects, and correspondingly, fewer and more dispersed initation points for aluminum flouride AlFx film defects compared to conventional supports, thereby resulting in reduced particle generation and longer support service life. An unanticipated benefit of the small grain size is the improved consistancy, repeatablity and quality of an anodic coating covering some embodiments of the body 102. The improved unformity and quality of the anodic coating provides improved heater performance.

The body 102 has an average grain size of less than about 250 μm may be obtained in a number of ways, of which an examplary is described below. It is contemplated that the average grain size of less than about 250 μm may be obtained in other ways that benefit from the invention. In embodiments wherein the body 102 is forged, the forgings may be graded by grain size such that only bodies having an average grain size less than about 250 μm are selected for further fabrication into the aluminum substrate support 100.

In some embodiments, the body 102 is casted in a manner that yields an average grain size of less than about 250 μm. The body 102 may be casted from substantially pure aluminum having an appropriate amount of a grain enhancer added to obtain the desired grain size. In certain embodiments, the grain enhancer is titanium (Ti). In one embodiment, between about 0.03 to about 0.1 weight percent of grain enhancer, such as titanium (Ti), may be utilized to produce an average grain size less than about 250 μm.

The heating element 106 is disposed in, embedded or otherwise coupled to the body 102. The heating element 106 may be a resistive heater, a conduit for circulating a heat transfer fluid or other suitable heat generator. In some embodiments, the heating element 106 is capable of elevating the temperature of the body 102 to about 480 degrees Celsius.

In one embodiment, the heating element 106 is a resistive heater having leads 108 extending from the bottom surface 112 of the body 102. The leads 108 exit the body 102 in a region circumscribed by the stem 104 and are routed though the stem 104 to facilitate coupling the heating element 106 to a power source for powering the heater.

In the embodiment depicted in FIG. 1, the heating element 106 is positioned in the center of the body 102, i.e., substantially equidistant from the bottom surface 112 and an opposing top surface 114 of the body 102. It is contemplated that the heating element 106 may be positioned in other orientations.

Figure 2:
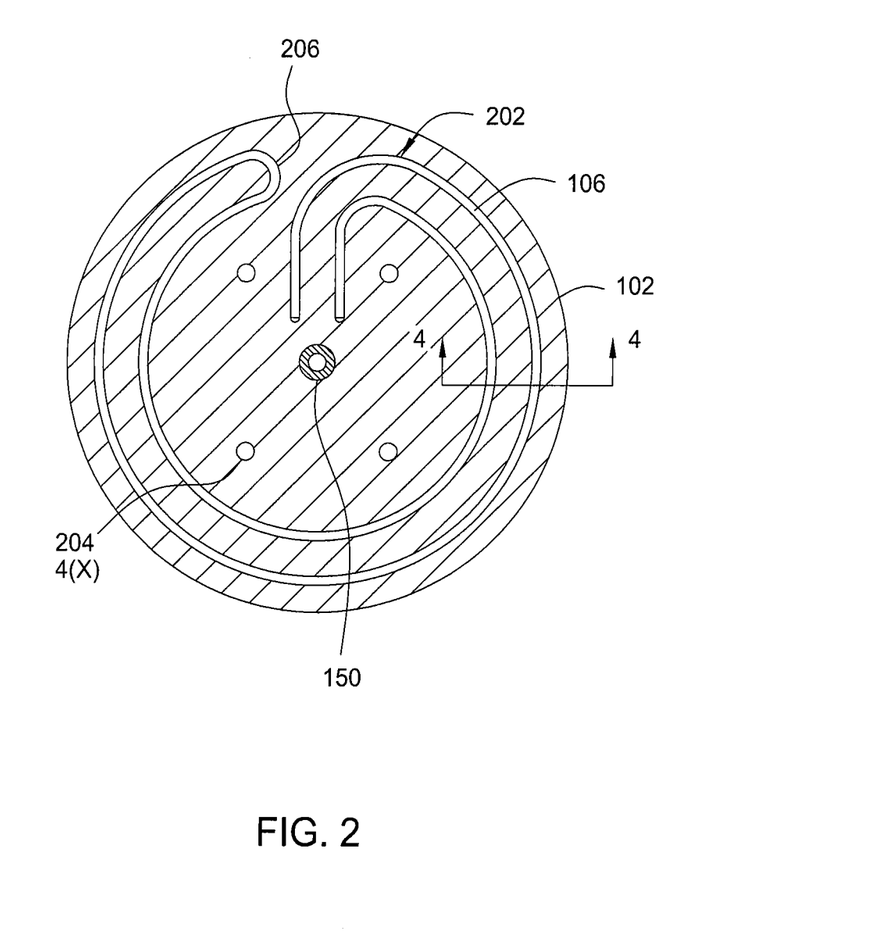
FIG. 2 is a horizontal sectional view of the heated substrate support of FIG. 1.

Referring to the sectional view of the body 102 depicted in FIG. 2, the heating element 106 is generally arranged in a double loop 202 routed radially outward of lift pin holes 204. A mid-point 206 of the heating element 106 is generally positioned substantially equidistant from two adjacent lift pin holes 204. The heating element 106 may be casted in place, embedded within a groove or disposed in the body 102 in another fashion.

Figure 3:
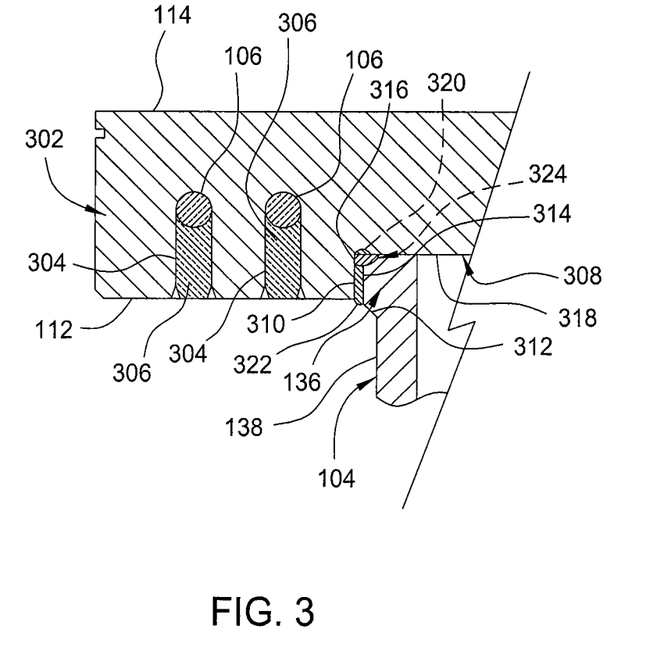
FIG. 3 vertical partial sectional view of another embodiment of a heated substrate support suitable for use with high temperature processing environments.

FIG. 3 depicts a partial sectional view of a body 302 having the heating element 106 embedded within a groove 304. The body 302 is substantially similar to the body 102 described above. The groove 304 may be formed in the body 302 during the casting, forging or other body forming process. Alternatively, the groove 304 may be machined or otherwise formed in the body 302 after the blank of the body 302 is fabricated.

In the embodiment depicted in FIG. 3, the body 302 is fabricated from a cold-worked aluminum stock plate, such as 6061-T651 wrought tooling plate, and has the groove 304 machined therein. The heating element 106 is disposed in the groove 304, in one example, by 6061-T651 wrought tooling plate, and has the groove 304 machined therein. The groove 304 may be sized accommodate the heating element 106 therein, and in one embodiment, the groove 304 may be sized such that the heating element 106 is press-fit or closely fit into the groove 304.

A cap 306 closes the groove 304 to capture the heating element 106 therein. The cap 306 may be welded to the body 302 using any suitable technique that produces a leak-tight joint between the body 302 and cap 306, such as an electron beam weld. The cap 306 and groove 304 geometry allows for the electron beam weld to fully penetrate into body material below the cap 306 to change the stress application point to an orientation perpendicular to the vertical orientation of the weld which greatly reduces leak potential.

The weld between the body 302 to the stem 104 is also depicted in FIG. 3. The body 102 and the stem 104 depicted in FIG. 1 may be similarly coupled. The body 302 includes a recess 308 configured to accept a mounting flange 136 formed at the first end 132 of the stem 104.

The mounting flange 136 includes an angled wall 312 that flares outward from the upper main shaft 138 of the stem 104 to an outer flange wall 314. The outer flange wall 314 is generally circular in form and includes a lip 316 extending radially outward from an end of the flange wall 314 opposite the angled wall 312. The lip 316 is dimensioned to fit closely to and/or press-fit into the sidewalls 310 of the recess 308. A weld 322, shown here as a lap joint, fills the gap defined between the sidewalls 310 of the recess 308 and the flange wall 314 of the stem 104. The exposed end of the weld 322 is not machined after welding. The weld 322 also fully penetrates through the lip 316 to the stem 104 and bottom 318 of the body recess 308 (as shown by phantom line 320), which results in the stress application point 324 of the weld 322 to be located at the side of the weld 322 along the plane of the first end 132 of the stem 104. Thus, the lip 316 becomes a sacrificial backing to form the weld root in material homogenous to the stem 104, thus eliminating the formation of a crack tip which can shorten life expectancy of the substrate support 302. The positioning of the stress application point 324 to the side of the weld 322 greatly increases the life cycle of the weld 322. As the substrate support of the present invention may be utilized in applications having a temperature in excess of 400 and up to 480 degrees Celsius, the resistance of the weld 322 to failure due to the angular offset, in this case about 90 degrees, between the plane of the weld 322 and the stress application point, provides a substantial improvement over conventional butt jointed designs.

Returning to FIG. 1, the body 102 of the substrate support 100 generally includes a blind hole 160 formed in the center of the upper surface 114 of the body 102. The hole 160 is utilized for locating a ceramic cover plate (not shown) upon which a substrate will rest during processing. It ensures good thermal contact between the ceramic cover plate and the body 102, as the upper surface 114 is roughened, for example, between 46 pin and 62 pin RMS.

Figure 4:
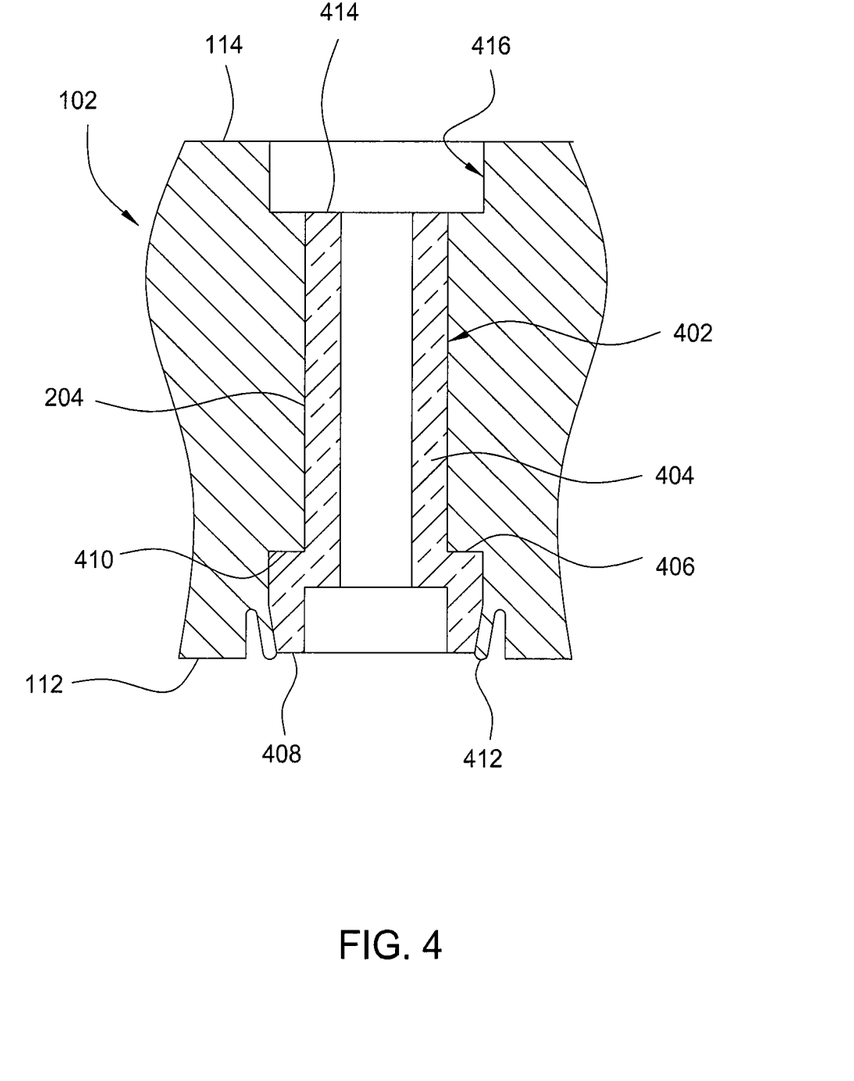
FIG. 4 is a partial sectional view of the heated substrate support taken along section line 4-4 of FIG. 2.

FIG. 4 is a partial sectional view of the substrate support 100 taken along section line 4-4 of FIG. 2 to illustrate a lift pin guide 402 disposed in the lift pin holes 204 of the body 102. The guide 402 has a tubular ceramic body 404 having a shoulder 406 formed near a lower end 408. The shoulder 406 is faced against a ledge 410 formed in the lift pin holes 204. An annular tab 412 formed in the bottom surface 112 of the body 102 is pressed radially inward against the lower end 408 of the guide 402 to lock the guide 402 within the lift pin hole 204. An upper surface 414 of the guide 402 is generally recessed from the upper surface 114 of the body 102. A counter bore 416, concentric with the lift pin holes 204, is provided in the upper surface 114 of the body 102 to accommodate the distal end of the lift pin (not shown) when recessed below the surface 114.

The fine grain substrate supports described above have demonstrated excellent aluminum fluoride film performance and extended service life as compared to conventional large grain supports, particularly at process temperatures ranging upward of 400 to 480 degrees Celsius, which is well in excess of recommended aluminum operational temperatures. For example, a substrate support having an average grain size of about 500 µm exhibited a fair amount of aluminum fluoride film defects (and consequently, unacceptable particle generation) after about 21,000 wafer process cycles while a substrate support having an average grain size of about 180 µm exhibited almost no aluminum fluoride film defects after about 335,000 wafer process cycles.

Figure 5:
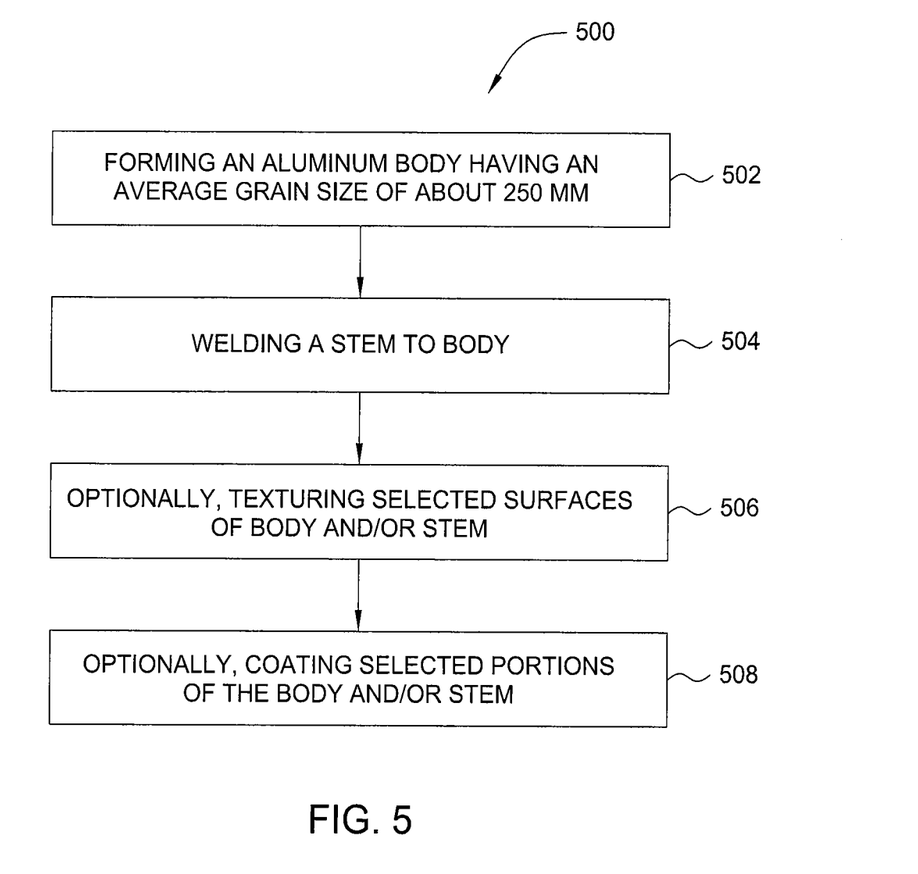
FIG. 5 is a flow diagram of one embodiment of a method 500 of fabricating a heated substrate support.

FIG. 5 is a flow diagram of one embodiment of a method 500 of fabricating a heated substrate support. The method 500 begins at step 502 by forming an aluminum body having an average grain size of about 250 µm.

In one embodiment, forming step 502 may include casting the body with a grain enhancer. A titanium or other suitable grain enhancer may be utilized. In one embodiment, between about 0.03 to about 0.1 weight percent of a titanium grain enhancer is utilized.

In another embodiment, forming step 502 may include grading aluminum bodies to select only bodies having an average grain size of about 250 µm are selected for further fabrication. The bodies may be fabricated by forging, casting or other method. In one embodiment, the formed body is a rolled aluminum plate.

The forming step includes heating element is installed in the body. In some embodiments wherein the body is casted, the heating element is cast in plate. In other embodiments wherein the body is casted, forged or a rolled aluminum plate, the heating element is disposed in a groove formed in the body. The groove may be capped using an electron beam weld or other suitable method.

At step 504, the stem is welded to the body. In one embodiment, the stem is welded to the body using a lap joint that fully penetrates the stem and body so that the stress application point to the weld is substantially perpendicular to the vertical orientation of the weld.

At an optional step 506, the body and/or stem and/or selected surfaces thereof may be textured. In one embodiment, the upper surface of the body is textured.

At an optional step 508, selected portions of the body may be coated. In one embodiment, the body is anodized while the stem is masked so that it remains a bare aluminum surface. In another embodiment, the body and stem are seasoned with a layer of aluminum fluoride (AlFx).

Thus, an aluminum heated substrate support and method for manufacturing the same has been provided that allows for improved processing of substrates in hot processing environments. The fine grain structure of the substrate support body ensures a more uniform dispersion of impurities by increasing the grain boundary surface area and limiting the size of the point defects caused by the impurities sitting at the grain boundaries, resulting in fewer defeat points from which aluminum fluoride film failure or particle generation may be initiated. Additionally, the fine grain body results in excellent anodic coating and robust heater performance, which is advantageously repeatable substrate support to substrate support. Thus, the fine grain structured substrate support provides superior aluminum fluoride film performance and correspondingly extended service life over conventional designs. Moreover, the improved weld joint between the stem and body of the present invention reduces the probability of weld failure over conventional designs, thereby further extending the service life of the inventive substrate support.

While the foregoing is directed to some embodiments of the present invention, other and further embodiments of the invention may be devised without departing from the basic scope thereof, and the scope thereof is determined by the claims that follow.

What is claimed is:

1. A substrate support suitable for use a semiconductor processing system, the substrate support comprising:
    an aluminum body for holding a semiconductor substrate and having an average grain size less than about 250 µm;
    a heating element disposed within a groove formed from a bottom surface of the aluminum body toward a center of the aluminum body; and
    a stem having a radially extending flange coupled to a bottom of a recess formed in the bottom surface of the aluminum body by a fully penetrated lap weld joint, wherein the groove is positioned radially outward from the stem.

2. The substrate support of claim 1 wherein the heating element further comprises:
    leads extending into the stem.

3. The substrate support of claim 1 further comprising:
    a ceramic guide disposed in a lift pin hole formed through the aluminum body.

4. The substrate support of claim 1, wherein the aluminum body further comprises:
    a grain enhancer.

5. The substrate support of claim 1, wherein the aluminum body further comprises:
    a titanium grain enhancer.

6. The substrate support of claim 1, wherein the aluminum body further comprises:
    between about 0.03 to about 0.1 weight percent of a titanium grain enhancer.

7. The substrate support of claim 1, wherein the aluminum body is cast or forged.

8. A substrate support suitable for use a semiconductor processing system, the substrate support comprising:
    a rolled aluminum body for holding a semiconductor substrate and having an average grain size less than about 250 µm;
    a heating element disposed in the rolled aluminum body within a groove formed from a bottom surface of the rolled aluminum body toward a center of the rolled aluminum body;
    a cap sealing the groove; and
    a stem having a radially extending flange coupled to a bottom of a recess formed in the bottom surface of the rolled aluminum body by a fully penetrated lap weld joint, and wherein the groove is positioned radially outward from the stem.

9. The substrate support of claim 8, wherein the rolled aluminum body further comprises:
    a 6061-T651 wrought tooling plate.

10. The substrate support of claim 8, wherein the stem is coupled to the bottom surface of the rolled aluminum body by a fully penetrated lap weld joint.

11. A method for fabricating a substrate support suitable for using in high temperature substrate processing environments, the method comprising:
    selecting an aluminum body having an average grain size less than about 250 µm, the aluminum body having a top surface for holding a semiconductor substrate and having a center blind hole and an opposing bottom surface;
    lap welding a tubular stem into a recess formed in the bottom surface of the aluminum body, wherein a lip of the tubular stem forms a sacrificial backing to form a weld root, wherein leads of a heating element disposed in the aluminum body extend into the tubular stem;
    forming a groove in the bottom surface of the aluminum body toward a center of the aluminum body that is sized to receive a heater element; forming a fluid-tight seal between the groove using a cap disposed in the groove and wherein the groove is positioned radially outward from the tubular stem.

12. The method of claim 11, wherein the selecting further comprises:
    selecting a forging from a plurality of forgings including forgings having an average grain size greater than about 250 µm.

13. The method of claim 11, further comprising: selecting a casting for the aluminum body having the top surface, the center blind hole and the opposing bottom surface.

14. The method of claim 13, wherein the casting comprises a grain enhancer.

15. The method of claim 13, wherein the casting comprises a titanium grain enhancer.

16. The method of claim 13, wherein the casting comprises between about 0.03 to about 0.1 weight percent of a titanium grain enhancer.

17. The method of claim 11, further comprising:
    forming a groove configured to accept the heating element in a rolled aluminum plate to form the aluminum body.

18. The method of claim 11, further comprising:
    forming a groove configured to accept the heating element in a 6061-T651 wrought aluminum tooling plate to form the aluminum body.

* * * * *